(12) United States Patent
Mani et al.

(10) Patent No.: US 6,452,198 B1
(45) Date of Patent: Sep. 17, 2002

(54) MINIMIZED CONTAMINATION OF SEMICONDUCTOR WAFERS WITHIN AN IMPLANTATION SYSTEM

(75) Inventors: Balaraman Mani, Cupertino, CA (US); Bill Chen, Saratoga, CA (US); Che-Hoo Ng, San Martin, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/893,847

(22) Filed: Jun. 28, 2001

(51) Int. Cl.[7] ................................. H01J 37/20
(52) U.S. Cl. ............................. 250/492.21; 250/492.2
(58) Field of Search ................... 250/492.21, 492.2, 250/398; 134/1, 1.1, 1.2, 1.3, 2, 36

(56) References Cited

U.S. PATENT DOCUMENTS

| | | | | |
|---|---|---|---|---|
| 5,455,426 A | * | 10/1995 | Forgery et al. | 250/492.21 |
| 5,466,942 A | * | 11/1995 | Sakai et al. | 250/492.2 |
| 5,554,854 A | * | 9/1996 | Blake | 250/492.21 |
| 5,940,300 A | * | 8/1999 | Ozaki | 364/468.28 |
| 6,093,625 A | * | 7/2000 | Wagner et al. | 438/514 |
| 6,113,703 A | * | 9/2000 | Anderson et al. | 118/725 |

* cited by examiner

Primary Examiner—Kiet T. Nguyen
(74) Attorney, Agent, or Firm—Monica H. Choi

(57) ABSTRACT

Contamination of semiconductor wafers are minimized during implantation processes within an implantation system. An implantation chamber of the implantation system and components within the implantation chamber are coated with additional material to minimize contaminants within the implantation chamber. For example, surfaces of the implantation chamber and/or the components of the implantation chamber are coated by performing an implantation process with a coating dopant before a semiconductor wafer is placed within the implantation chamber. In this manner, contaminants on the surfaces of the implantation chamber and/or the components within the implantation chamber are substantially coated and encapsulated with the coating dopant to prevent contact of the contaminant with the semiconductor wafer placed within the implantation chamber. Alternatively, shields are placed on surfaces of the implantation chamber and/or on surfaces of the components of the implantation chamber during an implantation process for a first semiconductor wafer having a contaminant source. Such shields are amenable for absorbing the contaminant and are removed after this implantation process and before a second semiconductor wafer is placed within the implantation chamber to minimize contamination of the second semiconductor wafer.

20 Claims, 9 Drawing Sheets

US 6,452,198 B1

MINIMIZED CONTAMINATION OF SEMICONDUCTOR WAFERS WITHIN AN IMPLANTATION SYSTEM

TECHNICAL FIELD

The present invention relates generally to implantation systems used for fabrication of integrated circuits, and more particularly, to mechanisms for minimizing contamination of semiconductor wafers during implantation processes within an implantation chamber of the implantation system.

BACKGROUND OF THE INVENTION

Referring to FIG. 1, a conventional implantation system 100 includes an ion beam source 102, an ion beam line 104, and an implantation chamber 106. Dopant ions are generated in the ion source 102, and the dopant ions travel through the ion beam line 104 to reach the implantation chamber 106. Upon reaching the implantation chamber 106, the dopant ions travel through an ion beam aperture 108 for entry into the implantation chamber 106. The dopant ions then travel though a plasma flood gun 110 which ensures uniform ionization of the dopant ions. The dopant ions are directed toward a semiconductor wafer placed on a wafer platen 112 with a voltage bias on the wafer platen 112.

The wafer platen 112 holds the semiconductor wafer to be implanted with the dopant ions within the implantation chamber 106. An ion beam profiler 114 within the implantation chamber 106 measures the dose of the dopant ions near the semiconductor wafer placed on the wafer platen 112. A dose cup 115 placed behind the wafer platen 112 is used to measure the dose of the dopant ions without the semiconductor wafer on the wafer platen 112 and without the wafer platen 112 within the implantation chamber 106 during characterizing and calibrating of the implantation system 100, as known to one of ordinary skill in the art of integrated circuit fabrication.

The conventional implantation system 100 with the components including the ion source 102, the ion beam line 104, the implantation chamber 106, the ion beam aperture 108, the plasma flood gun 110, the wafer platen 112, the ion beam profiler 114, and the dose cup 115 are known to one of ordinary skill in the art of integrated circuit fabrication. An example of such an implantation system is the model VIISta 80 commercially available from Varian Semiconductor Associates, Inc., headquartered in Gloucester, Mass.

Further referring to FIG. 1, in the prior art, a lot of a plurality of semiconductor wafers including a first semiconductor wafer 122 and a second semiconductor wafer 124 is processed within the implantation chamber 106. Each of the semiconductor wafers 122 and 124 is successively placed on the wafer platen 112 within the implantation chamber 106, and a respective implantation process is performed to implant each of the semiconductor wafers 122 and 124 with dopant ions from the ion source 102. For example, the first semiconductor wafer 122 is first placed on the wafer platen 112 within the implantation chamber 106, and a first implantation process is performed to implant the dopant ions into the first semiconductor wafer 122. After the first implantation process, the first semiconductor wafer 122 is removed from the implantation chamber 106, and the second semiconductor wafer 124 is placed on the wafer platen 112 within the implantation chamber 106. A second implantation process is performed to implant the dopant ions into the second semiconductor wafer 124.

A semiconductor wafer may have a material including a heavy metal compound deposited thereon. For example, oxides ($SiO_2$) of such a heavy metal such as oxides of hafnium (Hf), zirconium (Zr), holmium (Ho), molybdenum (Mo), or gadolinium (Gd) are deposited on the semiconductor wafer. Such a heavy metal oxide instead of pure oxide is used to surround interconnect structures of integrated circuits to increase the dielectric constant of the insulating material surrounding the interconnect structures for minimized parasitic capacitance between the interconnect structures.

Referring to FIG. 1, the first semiconductor wafer 122 for example may have such a heavy metal compound deposited thereon. When ion beams hit such material on the first semiconductor wafer 122 placed on the wafer platen 112 within the implantation chamber 106 during the first implantation process, the ion beams may detach the heavy metal compound from the first semiconductor wafer 122 to contaminate the implantation chamber 106 with such heavy metal compound landing on inside surfaces of the implantation chamber 106 and on surfaces of the components within the implantation chamber including the ion beam aperture 108, the plasma flood gun 110, the wafer platen 112, the ion beam profiler 114, and the dose cup 115. Such contamination is especially prevalent within implantation systems using a high implantation energy such as an implantation energy of about 40 KeV (Kilo-electron Volts).

Referring to FIG. 1, when the second semiconductor wafer 124 is placed on the wafer platen 122 of the implantation chamber 106, the heavy metal compound contaminants within the implantation chamber 106 from the first semiconductor wafer 122 may contaminate the second semiconductor wafer 124 during the second implantation process within the implantation chamber 106. For example, such heavy metal contaminants may contact and diffuse into a semiconductor wafer within the implantation chamber 106. Alternatively, such heavy metal contaminants may be incorporated into the dopant ion beam during an implantation process to be implanted into a semiconductor wafer. In addition, the heavy metal contaminant may hit the semiconductor wafer as back-scatter when the dopant ion beam strikes the heavy metal contaminants within the implantation chamber 106. In any case, as described in the journal article, *Behavior of Molybdenum in Silicon Evaluated for Integrated Circuit Processing*, by J. L. Benton, *Journal of the Electrochemical Society*, 146(5), 1929–1933, 1999, such heavy metal contaminants on a semiconductor wafer may deleteriously affect circuit performance of integrated circuit devices fabricated on the semiconductor wafer such as by increasing the leakage current of MOSFETs (Metal Oxide Semiconductor Field Effect Transistors) or BJTs (Bipolar Junction Transistors).

Thus, a mechanism is desired for minimizing the level of contamination of the implantation chamber from such heavy metals on semiconductor wafers when semiconductor wafers are processed within the implantation chamber.

SUMMARY OF THE INVENTION

Accordingly, in a general aspect of the present invention, the implantation chamber and components within the implantation chamber are coated with additional material to minimize such heavy metal contamination within the implantation chamber.

In one embodiment of the present invention, for minimizing contamination of a semiconductor wafer to be implanted with a fabrication dopant within an implantation system, surfaces of an implantation chamber of the implantation system are coated by performing a first implantation process with a coating dopant before the semiconductor wafer is placed within the implantation chamber. In this manner, contaminants on the surfaces of the implantation chamber are substantially coated with the coating dopant. In addition, surfaces of components disposed within the implantation chamber are coated with the coating dopant during the first implantation process. Thus, contaminants on the surfaces of the components of the implantation chamber are substantially coated with the coating dopant during the first implantation process. After coating the surfaces of the implantation chamber and the components of the implantation chamber, the semiconductor wafer is placed within the implantation chamber, and a second implantation process is performed for doping the semiconductor wafer with the fabrication dopant within the implantation chamber.

In this manner, because the contaminants, on the surfaces of the implantation chamber and on the surfaces of the components of the implantation chamber, are substantially coated with the coating dopant, contamination of the second semiconductor wafer is minimized during the second implantation process.

In another embodiment of the present invention, for minimizing contamination of semiconductor wafers within an implantation system, surfaces of an implantation chamber of the implantation system are covered with a chamber shield. A first semiconductor wafer having contaminants thereon is placed within the implantation chamber, and a first implantation process is performed with the first semiconductor wafer within the implantation chamber. The chamber shield absorbs the contaminants from the first semiconductor wafer during the first implantation process. After the first implantation process, the first semiconductor wafer is removed from the implantation chamber, and the chamber shield is removed from the implantation chamber. A second semiconductor wafer is then placed within the implantation chamber, and a second implantation process is performed for doping the second semiconductor wafer with a fabrication dopant within the implantation chamber.

In a further embodiment of the present invention, components within the implantation chamber are also covered with component shields during the first implantation process. The component shields are removed from the components of the implantation chamber before the second semiconductor wafer is placed within the implantation chamber for the second implantation process.

In this manner, the contaminants are absorbed by the chamber shield and/or the component shields that are removed from the implantation chamber before the second semiconductor wafer is placed within the implantation chamber for the second implantation process. Thus, the second semiconductor wafer is exposed to minimized contaminants from the first semiconductor wafer during the second implantation process.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, and 9 refer to elements having similar structure and function.

DETAILED DESCRIPTION

Figure 2:
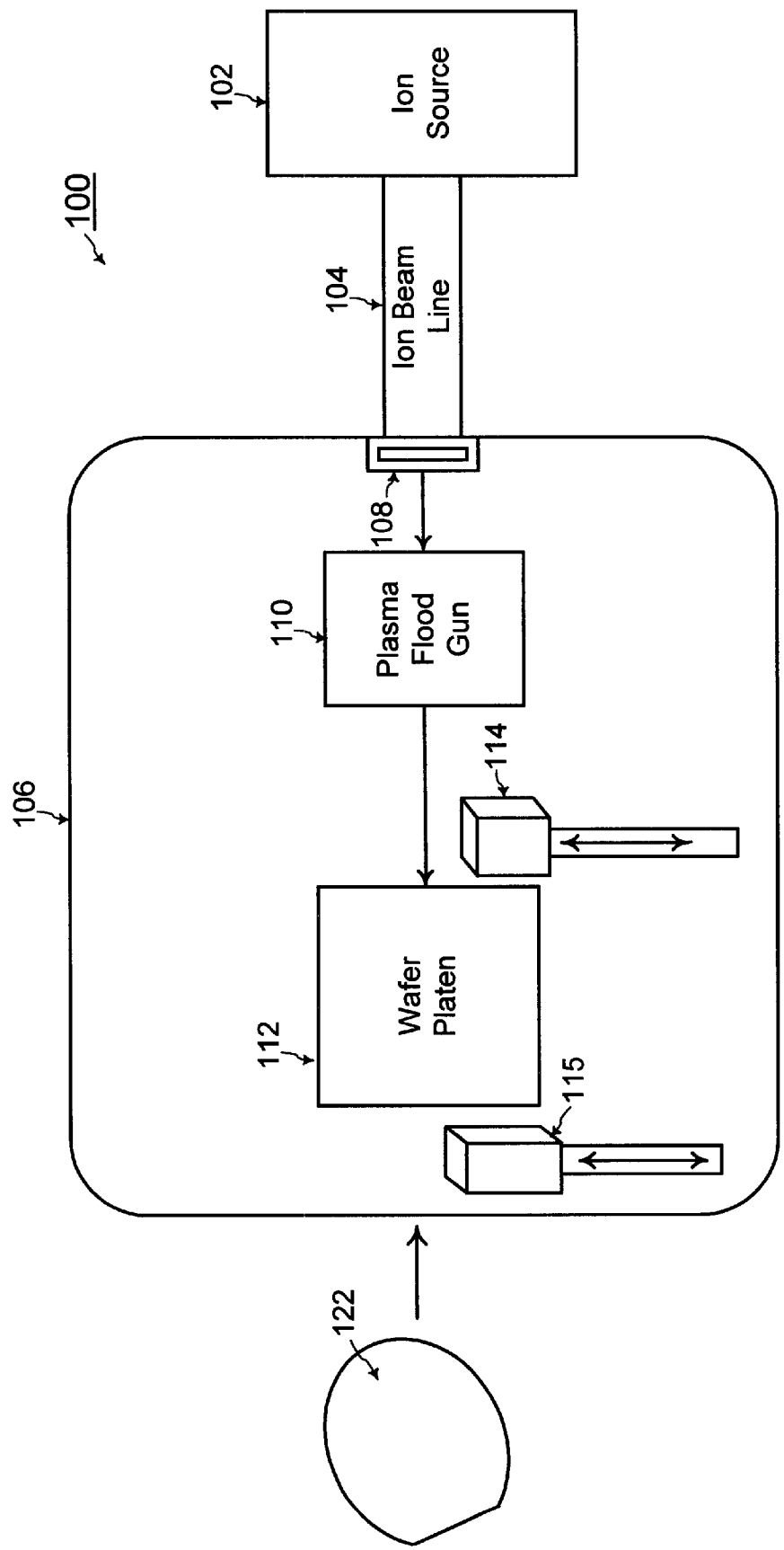
FIG. 2 shows the implantation system of FIG. 1 used for implanting a fabrication dopant into a first semiconductor wafer having a contaminant source thereon.

Referring to FIG. 2, according to an embodiment of the present invention, the first semiconductor wafer 122 having a contaminant source is processed within the implantation chamber 106 of the implantation system 100. For example, the contaminant source is a heavy metal compound such as an oxide of hafnium (Hf), zirconium (Zr), holmium (Ho), molybdenum (Mo), or gadolinium (Gd) to alter the dielectric constant of the dielectric material deposited on the first semiconductor wafer 122.

Figure 1:
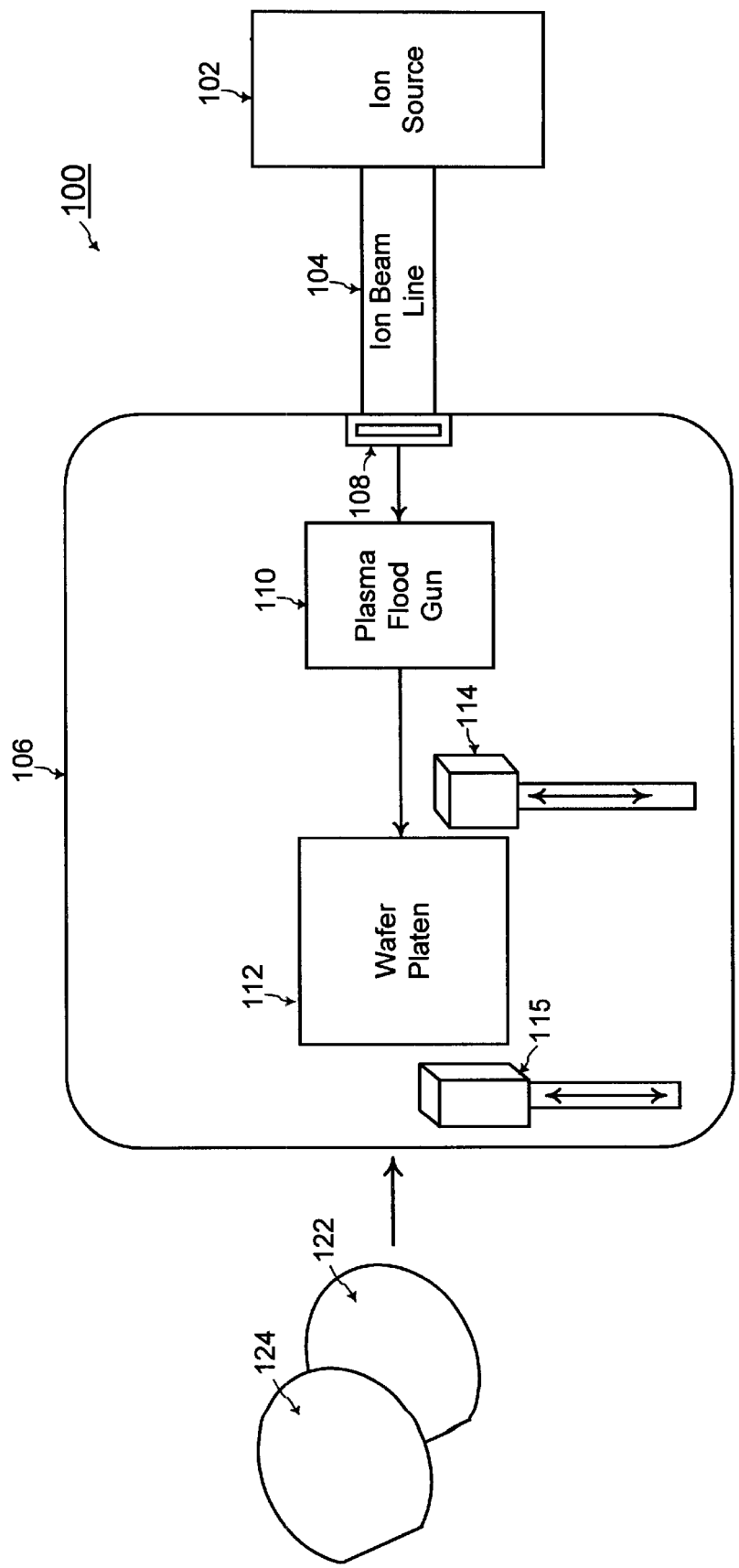
FIG. 1 shows the components of an implantation system that successively processes each of a lot of plurality of semiconductor wafers according to the prior art.

The implantation system 100 includes the ion source 102, the ion beam line 104, the implantation chamber 106, and components within the implantation chamber 106 such as the ion beam aperture 108, the plasma flood gun 110, the wafer platen 112, the ion beam profiler 114, and the dose cup 115 as described herein with reference to FIG. 1. An example of such an implantation system is the model VIISta 80 commercially available to one of ordinary skill in the art of integrated circuit fabrication from Varian Semiconductor Associates, Inc., headquartered in Gloucester, Mass.

The first semiconductor wafer 122 is placed on the wafer platen 112 within the implantation chamber 106, and a first implantation process is performed to implant an N-type or a P-type fabrication dopant into the first semiconductor wafer 122. Implantation processes in general within implantation systems are known to one of ordinary skill in the art of integrated circuit fabrication. Contaminants are detached from the first semiconductor wafer 122 during this first implantation process to contaminate the inside surfaces of the implantation chamber 106 and the surfaces of the components within the implantation chamber 106 including the ion beam aperture 108, the plasma flood gun 110, the wafer platen 112, the ion beam profiler 114, and the dose cup 115.

In the prior art, shortly after the first implantation process is performed with the first semiconductor wafer 122, the second semiconductor wafer 124 is placed on the wafer platen 112 within the implantation chamber 106, and a second implantation process is performed to implant an N-type or a P-type fabrication dopant into the second semiconductor wafer 124. The contaminants from the first semiconductor wafer 122 remaining on the inside surfaces of the implantation chamber 106 and the surfaces of the components of the implantation chamber 106 including the ion beam aperture 108, the plasma flood gun 110, the wafer platen 112, the ion beam profiler 114, and the dose cup may contaminate the second semiconductor wafer 124 during the second implantation process in the prior art.

Figure 3:
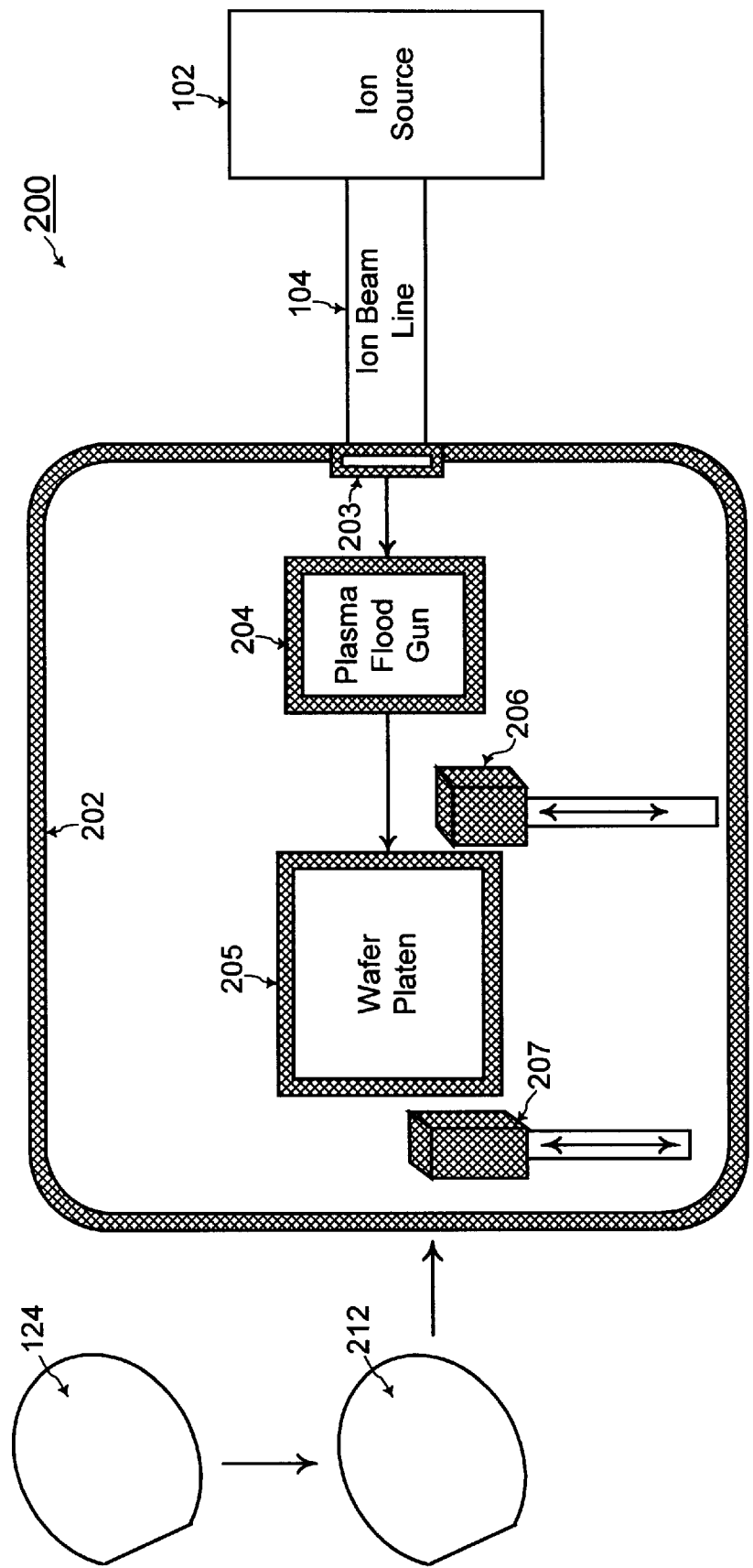
FIG. 3 shows an implantation system with an implantation chamber and with components of the implantation chamber being coated with a coating dopant before a second semiconductor wafer is placed within the implantation chamber, according to an embodiment of the present invention.

According to an embodiment of the present invention, referring to FIG. 3, before the second semiconductor wafer 124 is placed within the implantation chamber 106, the implantation system 100 is modified by performing an implantation process with a coating dopant. Further referring to FIGS. 2 and 3, a dummy wafer 212 comprised of substantially pure silicon is placed on the wafer platen 112, and an implantation process is performed with a coating dopant generated at the ion source 102.

After the implantation process with the coating dopant, a modified implantation system 200 of FIG. 3 includes a layer of the coating dopant 202 on the inner surfaces of the implantation chamber 106 (as illustrated with the hatched shading 202 in FIG. 3). In addition, after the implantation process with the coating dopant, a layer of the coating dopant, 203, 204, 205, 206, and 207, respectively, are also formed on the exposed surfaces of the components within the implantation chamber 102 including the ion beam aperture 108, the plasma flood gun 110, the wafer platen 112, the ion beam profiler 114, and the dose cup 115 (as illustrated by the hatched shading in FIG. 3).

Arsenic is used as the coating dopant according to one embodiment of the present invention. An implantation process using arsenic as the coating dopant with a dose in a range of from about $1 \times 10^{15}$/cm$^2$ to about $1 \times 10^{17}$/cm$^2$, for an implantation time period of from about 3.5 hours to about 4.5 hours, and with an implantation energy of from about 35 KeV (Kilo-electron Volts) to about 45 KeV (Kilo-electron Volts) is performed to form the layers of coating dopant 202, 203, 204, 205, 206, and 207 on the inside surfaces of the implantation chamber 106 and on the exposed surfaces of the components 108, 110, 112, 114, and 115 within the implantation chamber 106, according to one embodiment of the present invention.

Implantation processes in general within implantation systems are known to by one of ordinary skill in the art of integrated circuit fabrication. The contaminant on the inside surfaces of the implantation chamber 106 and on the surfaces of the components 108, 110, 112, 114, and 115 within the implantation chamber 106 from the first semiconductor wafer 122 is substantially coated by the layers of coating dopant 202, 203, 204, 205, 206, and 207 to be encapsulated by the coating dopant.

Further referring to FIG. 3, after forming the layers of coating dopant on the inside surfaces of the implantation chamber 106 and on the surfaces of the components 108, 110, 112, 114, and 115 within the implantation chamber 106, the second semiconductor wafer 124 is placed on the wafer platen 112. A second implantation process is performed to implant an N-type or a P-type fabrication dopant into the second semiconductor wafer 124. Because the contaminant from the first semiconductor wafer 122 is substantially encapsulated by the layers of coating dopant 202, 203, 204, 205, 206, and 207 on the surfaces of the implantation chamber 106 and of the components 108, 110, 112, 114, and 115 within the implantation chamber 106, the second semiconductor wafer 124 is not exposed to such contaminant during the second implantation process to minimize contamination of the second semiconductor wafer 124.

Figure 4:
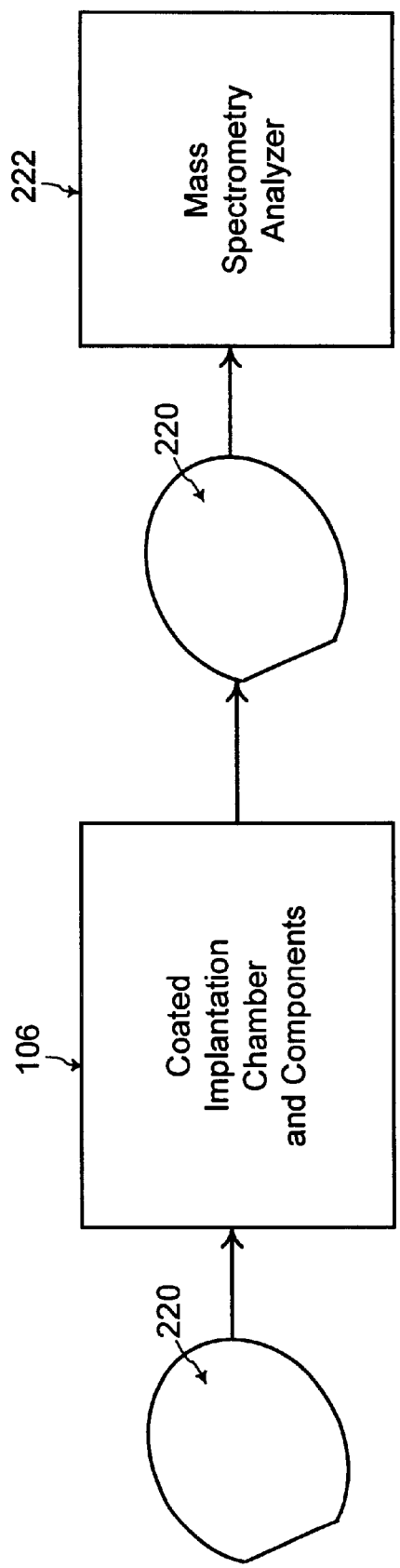
FIG. 4 illustrates using a monitoring wafer within the implantation chamber coated with the coating dopant to determine the contamination level before the second semiconductor wafer is placed within the implantation chamber, according to an embodiment of the present invention.

Referring to FIG. 4, according to another embodiment of the present invention, before the second semiconductor wafer 124 is placed within the implantation chamber 106 for the second implantation process, the level of contamination within the implantation chamber 106 with the layers of the coating dopant 202, 203, 204, 205, 206, and 207 is determined with a monitoring wafer 220. In this embodiment, referring to FIGS. 3 and 4, the monitoring wafer 220 is placed on the wafer platen 112 within the implantation chamber 106 covered with the layers of coating dopant 202, 203, 204, 205, 206, and 207, and an implantation process is performed with a dummy dopant. The dummy dopant is an inert element such as argon for example according to one embodiment of the present invention.

In addition, the monitoring wafer 220 is comprised of substantially pure silicon with a layer of silicon dioxide ($SiO_2$) having a thickness in a range of from about angstroms to about 300 angstroms deposited thereon. The layer of silicon dioxide ($SiO_2$) is amenable for retaining any contaminant that contacts the monitoring wafer 220 during this implantation process. Referring to FIG. 4, after the implantation process with the dummy dopant for the monitoring wafer 220, the level of contamination on the monitoring wafer 220 is determined within a mass spectrometry analyzer 222.

The mass spectrometry analyzer 222 determines a concentration of contaminants such as heavy metal compounds at or near the surface of the monitoring wafer 220. Mass spectrometry analyzers for determining the concentration of contaminants at or near a surface are known to one of ordinary skill in the art of integrated circuit fabrication. An example of such a mass spectrometry analyzer available to one of ordinary skill in the art of integrated circuit fabrication is the model 610-DRC from Perkin Elmer Co., headquartered in Palo Alto, Calif.

If the level of contamination on the monitoring wafer 220 as measured by the mass spectrometry analyzer 222 is within an acceptable range, then the second semiconductor wafer 124 is placed within the implantation chamber 106 for performing the second implantation process. For example, if the contaminant is molybdenum, then the acceptable range of contamination on the monitoring wafer 220 is less than $1\times10^{10}/cm^2$. On the other hand, if the level of contamination on the monitoring wafer 220 as measured by the mass spectrometry analyzer 222 is not within the acceptable range, then another implantation process with the coating dopant may be performed with the dummy wafer 212 within the implantation chamber 106 to further coat the surfaces of the implantation chamber 106 and the surfaces of the components 108, 110, 112, 114, and 115 within the implantation chamber 106 with the coating dopant.

Figure 5:
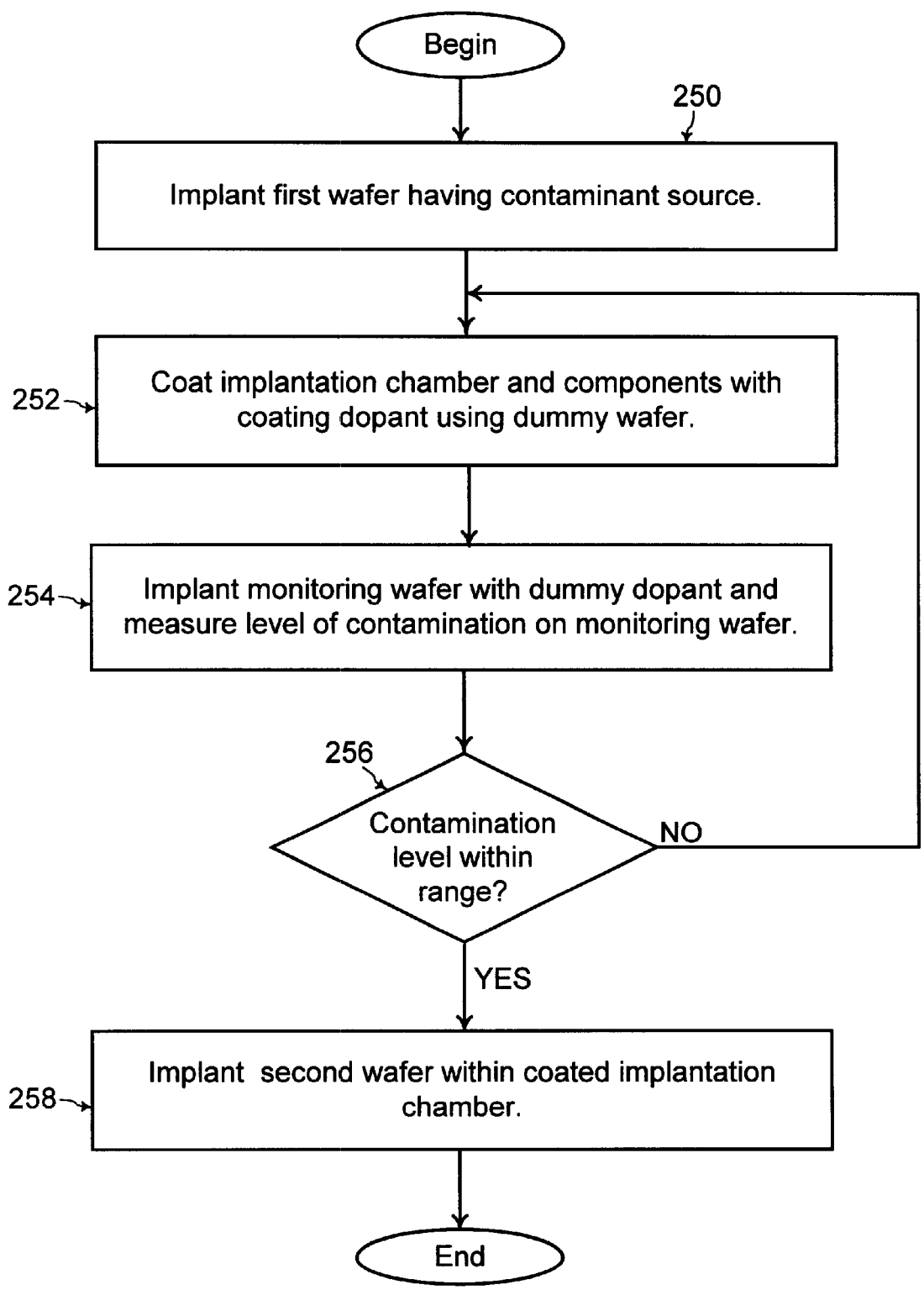
FIG. 5 shows a flowchart of the steps for minimizing contamination of the second semiconductor wafer by coating the implantation chamber and the components of the implantation chamber with the coating dopant before the second semiconductor wafer is placed within the implantation chamber, according to an embodiment of the present invention.

FIG. 5 shows a flowchart summarizing the steps for minimizing contamination of the second semiconductor wafer 124 by coating the implantation chamber 106 and the components 108, 110, 112, 114, and 115 of the implantation chamber 106 with the coating dopant 202 before the second semiconductor wafer 124 is placed within the implantation chamber 106, according to an embodiment of the present invention. Referring to FIGS. 2 and 5, the first semiconductor wafer 122 having the potential contaminant source is placed on the wafer platen 112 within the implantation chamber 106, and the first implantation process is performed for implanting the N-type or P-type fabrication dopant into the first semiconductor wafer 122 (step 250 in FIG. 5). After the first implantation process, the first semiconductor wafer 122 is removed from the implantation chamber 106.

Referring to FIGS. 3 and 5, the dummy wafer 212 is placed on the wafer platen 112 within the implantation chamber 106, and an implantation process is performed with the coating dopant such as arsenic for example to cover the inside surfaces of the implantation chamber 106 and the surfaces of the components 108, 110, 112, 114, and 115 within the implantation chamber 106 with the coating dopant (step 252 in FIG. 5). After this implantation process for coating the inside surfaces of the implantation chamber 106 and the surfaces of the components 108, 110, 112, 114, and 115 within the implantation chamber 106 with the coating dopant, the dummy wafer 212 is removed from the implantation chamber.

Referring to FIGS. 4 and 5, the monitoring wafer 220 is placed on the wafer platen 112 within the implantation chamber 106, and an implantation process is performed with the dummy dopant such as argon for example (step 254 of FIG. 5). The level of contamination on the monitoring wafer 220 is then determined by the mass spectrometry analyzer 222 (step 254 of FIG. 5).

If the contamination level on the monitoring wafer 220 is within the acceptable range (step 256 in FIG. 5), the second semiconductor wafer 124 is placed on the wafer platen 112 within the implantation chamber 106, and the second implantation process is performed for implanting the N-type or P-type fabrication dopant into the second semiconductor wafer 124 (step 258 in FIG. 5). On the other hand, if the contamination level on the monitoring wafer 220 is not within the acceptable range (step 256 in FIG. 5), the steps of performing the implantation process with the coating dopant and the dummy wafer 212 and performing the implantation process with the dummy dopant and the monitoring wafer 220 are repeated to further coat the surfaces of the implantation chamber 106 and of the components 108, 110, 112, 114, and 115 within the implantation chamber 106 with the coating dopant until the level of contamination of the monitoring wafer 220 is within the acceptable range (steps 252, 254, and 256 in FIG. 5).

In this manner, the contaminants on the surfaces of the implantation chamber 106 and of the components 108, 110, 112, 114, and 115 within the implantation chamber 106 are sufficiently coated with the coating dopant after the implantation process for the first semiconductor wafer 122 having the contaminant source. Thus, contamination of the second semiconductor wafer 124 is minimized during the second implantation process. In addition, the monitoring wafer 220 is used to ensure that the level of contamination is within an acceptable range before the second implantation process is performed within the implantation chamber 106 for the second semiconductor wafer 124. However, the present invention may be practiced with or without the use of the monitoring wafer 220 for minimizing contamination on the second semiconductor wafer 124.

Figure 6:
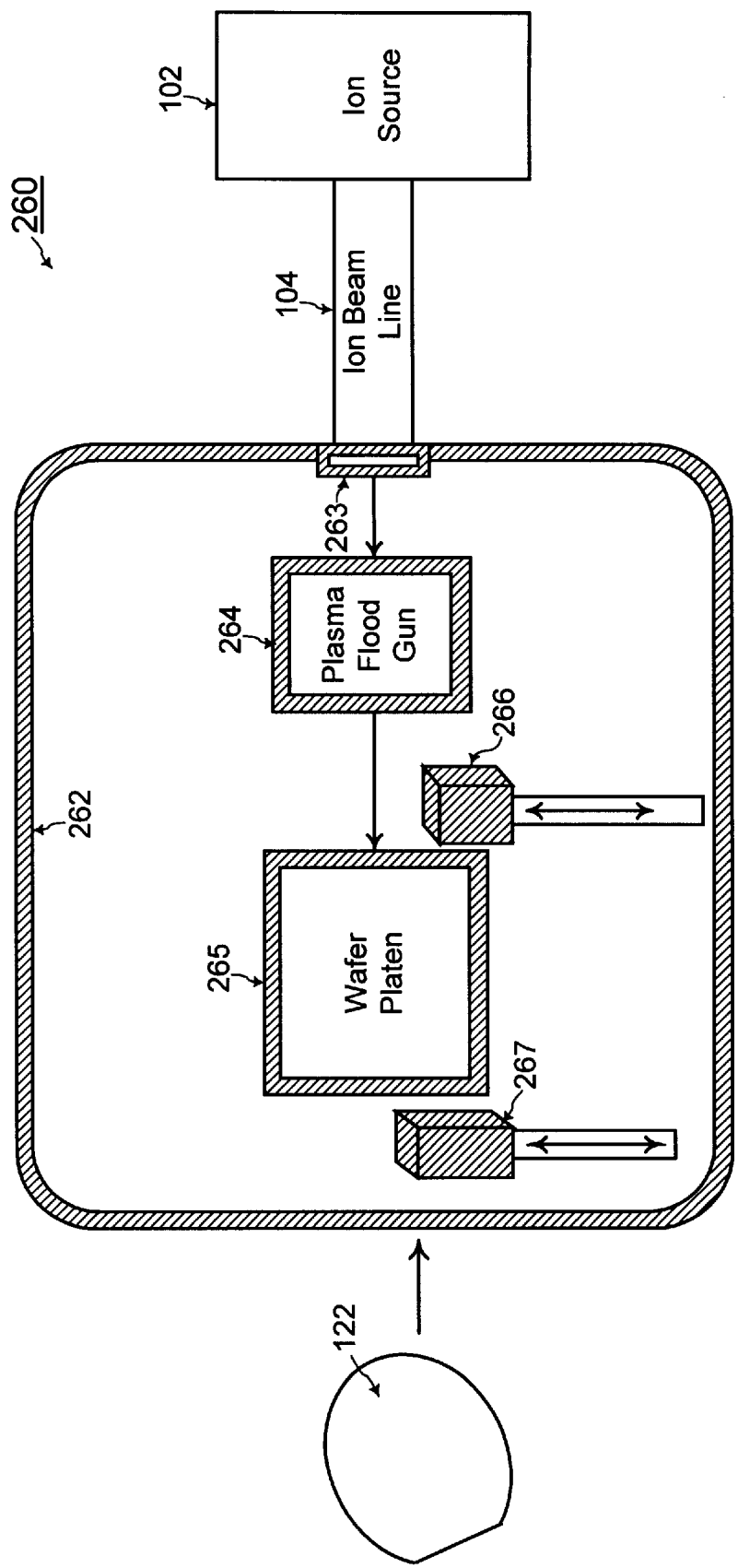
FIG. 6 shows an implantation system with the implantation chamber and with the components of the implantation chamber being covered with a chamber shield and with component shields before the first semiconductor wafer having the contaminant source thereon is processed within the implantation chamber, according to another embodiment of the present invention.

Referring to FIG. 6, in another embodiment of the present invention for minimizing contamination within an implantation system 260, a chamber shield 262 (shown with dashed shading in FIG. 6) is formed on the inside surfaces of the implantation chamber 106. In addition, component shields 263, 264, 265, 266, and 267, respectively, are also formed on surfaces of the components 108, 110, 112, 114, and 115 within the implantation chamber 106. The chamber shield 262 and the component shields 263, 264, 265, 266, and 267 are comprised of one of a layer of substantially pure graphite or a sheet of aluminum with a layer of graphite coated on the sheet of aluminum, according to one embodiment of the present invention.

Such a chamber shield 262 is attached to the inside surfaces of the implantation chamber 106 to cover such inside surfaces of the implantation chamber 106 with the chamber shield 262. In addition, such component shields 263, 264, 265, 266, and 267 are attached to exposed surfaces of the components 108, 110, 112, 114, and 115 within the implantation chamber 106 to cover the exposed surfaces of the components 108, 110, 112, 114, and 115. Technology for forming a layer of substantially pure graphite or a layer of graphite on a sheet of aluminum and attaching such a shield to objects are known to one of ordinary skill in the art of material science.

Further referring to FIG. 6, in this embodiment of the present invention, the first semiconductor wafer 122 having the contaminant source is placed on the wafer platen 112 within the implantation chamber 106 after the chamber shield 262 and the component shields 263, 264, 265, 266, and 267 are placed within the implantation chamber 106. During the first implantation process for implanting the N-type or P-type fabrication dopant into the first semiconductor wafer 122, the graphite coating of the chamber shield 262 and the component shields 263, 264, 265, 266, and 267 is amenable for absorbing the contaminants such as heavy metal compounds from the first semiconductor wafer 122 since graphite is a porous material. In addition, the graphite coating is also amenable for discharging any charge build-up on the contaminants that contact such graphite coating of the chamber shield 262 and the component shields 263, 264, 265, 266, and 267.

Figure 7:
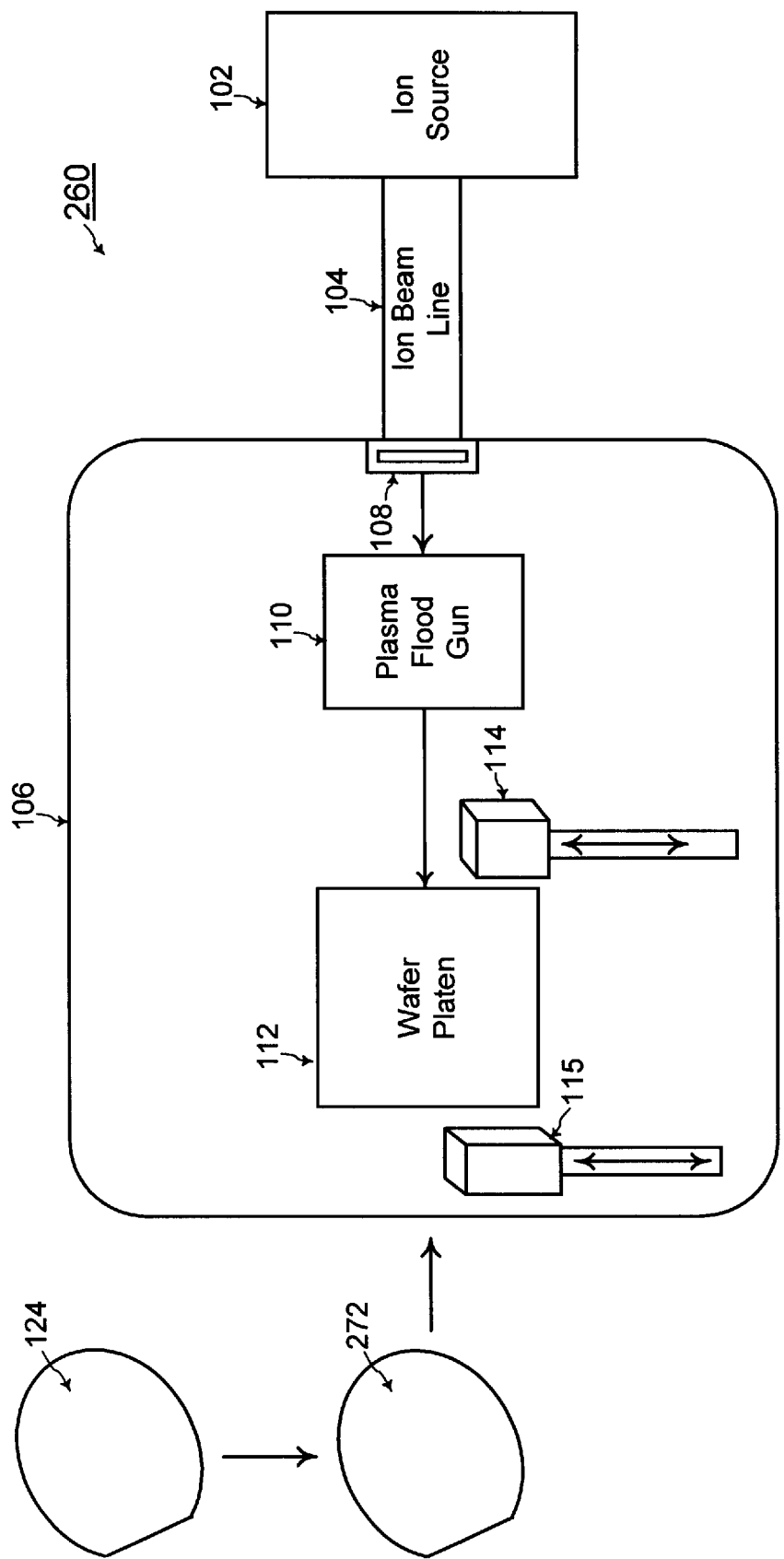
FIG. 7 shows placing the second semiconductor wafer within the implantation chamber after the chamber shield and the component shields are removed for the second implantation process within the implantation chamber, according to the other embodiment of the present invention.

Referring to FIG. 7, after the first implantation process for the first semiconductor wafer 122, the chamber shield 262 and the component shields 263, 264, 265, 266, and 267 are removed from the implantation chamber 106. The chamber shield 262 and the component shields 263, 264, 265, 266, and 267 retain the contaminant resulting from the first implantation process for the first semiconductor wafer 122 such that such contaminant is removed from the implantation chamber 106 when the chamber shield 262 and the component shields 263, 264, 265, 266, and 267 are removed from the implantation chamber 106. The second semiconductor wafer 124 is placed on the wafer platen 112 within the implantation chamber 106 for performing the second implantation process after the chamber shield 262 and the component shields 263, 264, 265, 266, and 267 are removed from the implantation chamber 106 for minimized contamination of the second semiconductor wafer 124.

Figure 8:
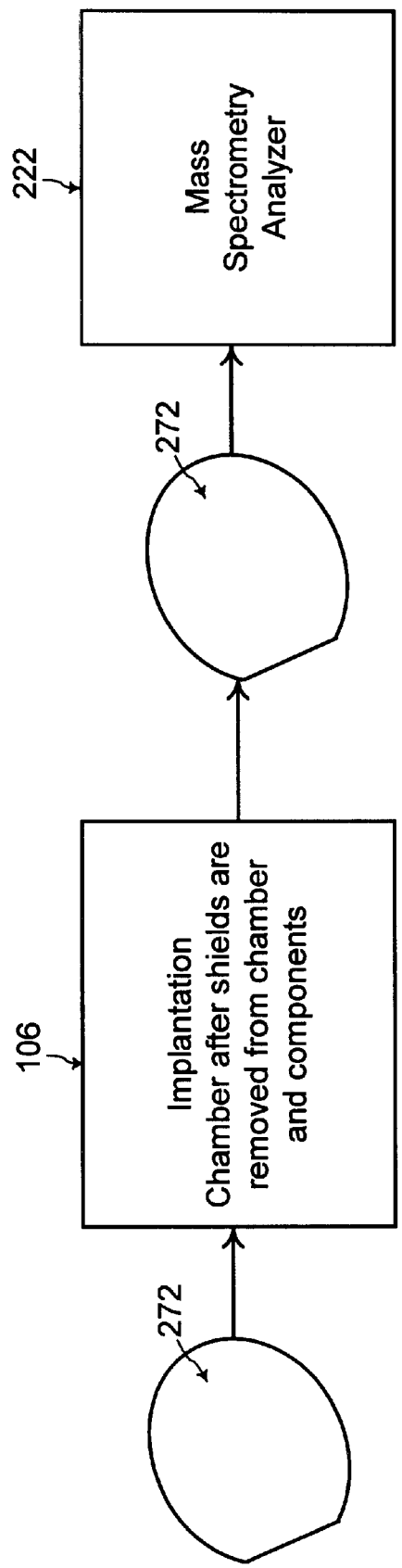
FIG. 8 illustrates using a monitoring wafer within the implantation chamber after the chamber shield and the component shields are removed to determine the contamination level before the second semiconductor wafer is placed within the implantation chamber, according to the other embodiment of the present invention.

Referring to FIG. 8, in another embodiment of the present invention, before the second semiconductor wafer 124 is placed within the implantation chamber 106 for the second implantation process, the level of contamination within the implantation chamber 106 after the chamber shield 262 and the component shields 263, 264, 265, 266, and 267 are removed from the implantation chamber 106 is determined with a monitoring wafer 272. In this embodiment, referring to FIGS. 7 and 8, the monitoring wafer 272 is placed on the wafer platen 112 within the implantation chamber 106 after the chamber shield 262 and the component shields 263, 264, 265, 266, and 267 are removed from the implantation chamber 106, and an implantation process is performed with a dummy dopant. The dummy dopant is an inert element such as argon for example according to one embodiment of the present invention.

In addition, the monitoring wafer 272 is comprised of substantially pure silicon with a layer of silicon dioxide ($SiO_2$) having a thickness in a range of from about 30 angstroms to about 300 angstroms deposited thereon. The layer of silicon dioxide ($SiO_2$) is amenable for retaining any contaminant that contacts the monitoring wafer 272 during this implantation process. Referring to FIG. 8, after the implantation process with the dummy dopant for the monitoring wafer 272, the level of contamination on the monitoring wafer 272 is determined within the mass spectrometry analyzer 222.

If the level of contamination on the monitoring wafer 272 as measured by the mass spectrometry analyzer 222 is within an acceptable range, then the second semiconductor wafer 124 is placed within the implantation chamber 106 for performing the second implantation process. For example, if the contaminant is molybdenum, then the acceptable range of contamination on the monitoring wafer 272 is less than $1 \times 10^{10}/cm^2$. On the other hand, if the level of contamination on the monitoring wafer 272 as measured by the mass spectrometry analyzer 222 is not within the acceptable range, then the implantation chamber 106 is not used for processing the second semiconductor wafer 124.

Figure 9:
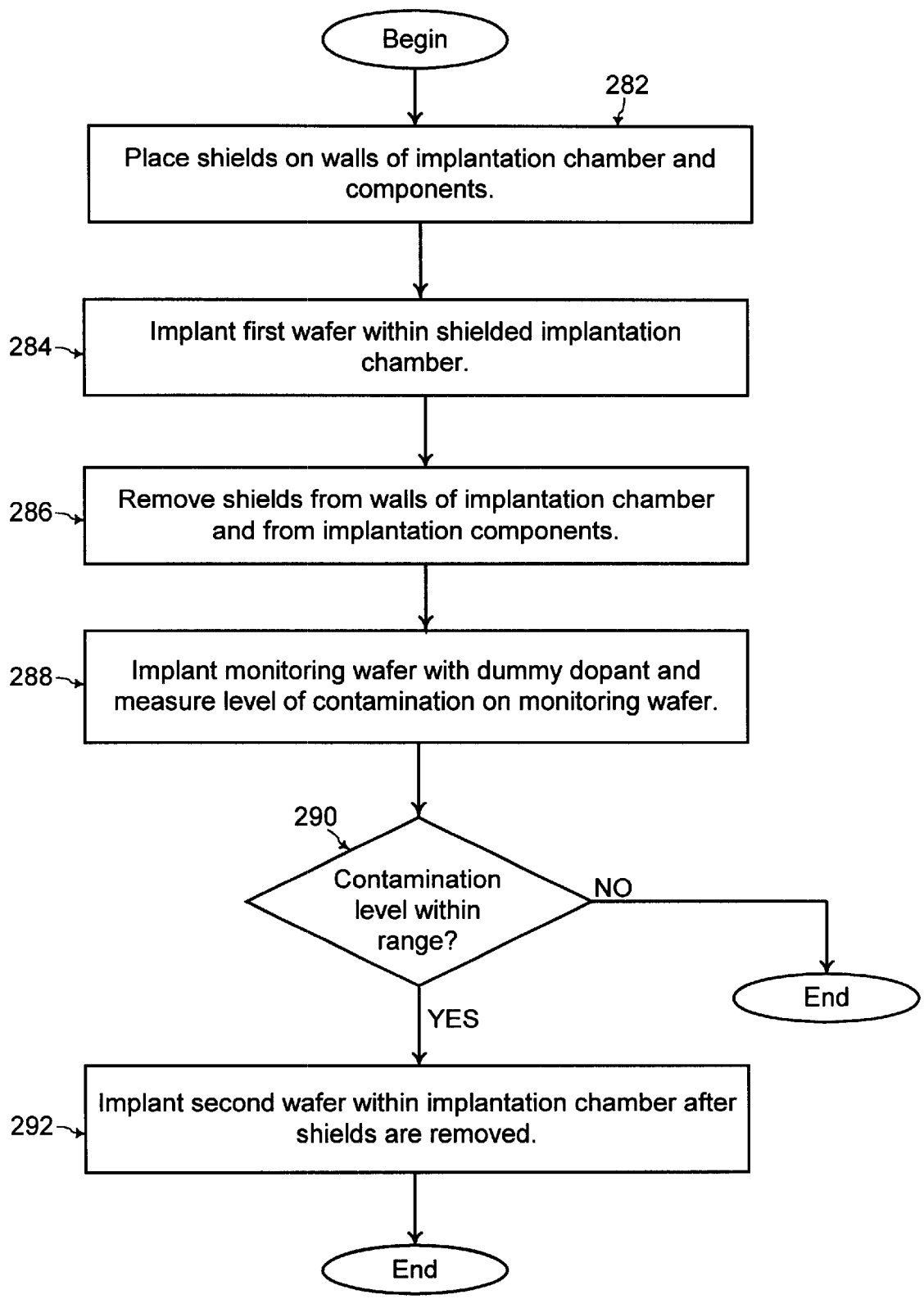
FIG. 9 shows a flowchart of the steps for minimizing contamination of the second semiconductor wafer by covering the implantation chamber and the components of the implantation chamber with the chamber shield and the component shields during the first implantation process and removing the chamber shield and the component shields after the first implantation process and before placing the second semiconductor wafer within the implantation chamber for the second implantation process, according to the other embodiment of the present invention.

FIG. 9 shows a flowchart summarizing the steps for minimizing contamination of the second semiconductor wafer 124 by using the chamber shield 262 and the component shields 263, 264, 265, 266, and 267 according to an embodiment of the present invention. Referring to FIGS. 6 and 9, the chamber shield 262 is attached to the inside surfaces of the implantation chamber 106, and component shields 263, 264, 265, 266, and 267, respectively, are attached to exposed surfaces of the components 108, 110, 112, 114, and 115 within the implantation chamber 106 (step 282 of FIG. 9). The first semiconductor wafer 122 having the potential contaminant source is placed on the wafer platen 112 within the implantation chamber 106, and the first implantation process is performed for implanting the N-type or P-type fabrication dopant into the first semiconductor wafer 122 (step 284 in FIG. 9).

After the first implantation process, the first semiconductor wafer 122 is removed from the implantation chamber 106. In addition, the chamber shield 262 and the component shields 263, 264, 265, 266, and 267 are removed from the implantation chamber 106 (step 286 of FIG. 9). Referring to FIGS. 8 and 9, after the chamber shield 262 and the component shields 263, 264, 265, 266, and 267 are removed from the implantation chamber 106, the monitoring wafer 272 is placed on the wafer platen 112 within the implantation chamber 106, and an implantation process is performed with the dummy dopant such as argon for example (step 288 in FIG. 9). The level of contamination on the monitoring wafer 272 is then determined by the mass spectrometry analyzer 222 (step 288 of FIG. 5).

If the contamination level on the monitoring wafer 272 is within the acceptable range (step 290 in FIG. 9), then the second semiconductor wafer 124 is placed on the wafer platen 112 within the implantation chamber 106, and the second implantation process is performed for implanting the N-type or P-type fabrication dopant into the second semiconductor wafer 124 after the chamber shield 262 and the component shields 263, 264, 265, 266, and 267 are removed from the implantation chamber 106 (step 292 in FIG. 9). On the other hand, if the contamination level on the monitoring wafer 272 is not within the acceptable range (step 290 in FIG. 9), the implantation chamber 106 is not used for processing the second semiconductor wafer 124.

In this manner, the contaminants on the surfaces of the implantation chamber 106 and on the surfaces of the components 108, 110, 112, 114, and 115 within the implantation chamber 106 are minimized because such surfaces are covered with the chamber shield 262 and the component shields 263, 264, 265, 266, and 267 during the implantation process for the first semiconductor wafer 122 having the contaminant source. The chamber shield 262 and the component shields 263, 264, 265, 266, and 267 are removed from the implantation chamber 106 before the second semiconductor wafer 124 is placed inside the implantation chamber 106 to minimize contamination of the second semiconductor wafer 124 during the second implantation process. In addition, the monitoring wafer 272 is used to ensure that the level of contamination is within an acceptable range before the second implantation process is performed within the implantation chamber 106 for the second semiconductor wafer 124. However, the present invention may be practiced with or without the use of the monitoring wafer 272 for minimizing contamination on the second semiconductor wafer 124.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method for minimizing contamination of a semiconductor wafer to be implanted with a fabrication dopant within an implantation system, the method including the steps of:

A. coating surfaces of an implantation chamber of said implantation system by performing a first implantation process with a coating dopant, before said semiconductor wafer is placed within said implantation chamber, to encapsulate contaminants on said surfaces of said implantation chamber with said coating dopant during said step A;

B. coating surfaces of components disposed within said implantation chamber with said coating dopant, during said step A, to encapsulate contaminants on said surfaces of said components of said implantation chamber with said coating dopant during said step B;

C. placing said semiconductor wafer within said implantation chamber after said steps A and B; and D. performing a second implantation process for doping said semiconductor wafer with said fabrication dopant within said implantation chamber, after said step C.

2. The method of claim 1, wherein said coating dopant is comprised of arsenic.

3. The method of claim 2, wherein said first implantation process is performed with a dose of said coating dopant being in a range of from about $1\times10^{15}$ ions/cm$^2$ to about $1\times10^{17}$ ions/cm$^2$.

4. The method of claim 3, wherein said first implantation process is performed for a time period in a range of from about 3.5 hours to about 4.5 hours.

5. The method of claim 4, wherein said first implantation process is performed with a high implantation energy in a range of from about 35 KeV to about 45 KeV.

6. The method of claim 1, further including the steps of:
placing a monitoring wafer within said implantation chamber and performing a third implantation process within said implantation chamber to implant a dummy dopant into said monitoring wafer, after said step B and before said step C;
determining a level of contamination of said monitoring wafer after said third implantation process; and
performing said steps C and D if said level of contamination of said monitoring wafer after said third implantation process is less than an upper limit.

7. The method of claim 6, further including the steps of:
further coating said surfaces of said implantation chamber and of said components of the implantation chamber by repeating said steps A and B to perform another implantation process with said coating dopant if said level of contamination of said monitoring wafer after said third implantation process is not less than said upper limit, before said steps C and D.

8. The method of claim 1, wherein said components disposed within said implantation chamber and coated with said coating dopant in said step B include an ion beam aperture, a plasma flood gun, an ion beam profiler, a wafer platen, and a dose cup.

9. The method of claim 1, wherein a dummy wafer comprised of substantially pure silicon is placed within said implantation chamber during said first implantation process.

10. The method of claim 1, wherein said contaminants on said surfaces of said implantation chamber and on said surfaces of said components of said implantation chamber include heavy metal compound displaced from a first semiconductor wafer processed within said implantation chamber before said step A.

11. An implantation system with minimized contamination of a semiconductor wafer to be implanted with a fabrication dopant within the implantation system, the implantation system comprising:
an implantation chamber having surfaces coated with a coating dopant by performing a first implantation process with said coating dopant within said implantation chamber to encapsulate contaminants on said surfaces of said implantation chamber with said coating dopant; and
components disposed within said implantation chamber and having surfaces coated with said coating dopant during said first implantation process to encapsulate contaminants on said surfaces of said components of said implantation chamber with said coating dopant;
and wherein said semiconductor wafer is placed within said implantation chamber for performing a second implantation process for doping said semiconductor wafer with said fabrication dopant, after said surfaces of said implantation chamber and said surfaces of said components of said implantation chamber are coated with said coating dopant.

12. The implantation system of claim 11, wherein said coating dopant is comprised of arsenic.

13. The implantation system of claim 12, wherein said surfaces of said implantation chamber and said surfaces of said components within said implantation chamber are coated with said coating dopant during said first implantation process that is performed with a dose of said coating dopant being in a range of from about $1\times10^{15}$ ions/cm$^2$ to about $1\times10^{17}$ ions/cm$^2$.

14. The implantation system of claim 13, wherein said surfaces of said implantation chamber and said surfaces of said components of said implantation chamber are coated with said coating dopant during said first implantation process that is performed for a time period in a range of from about 3.5 hours to about 4.5 hours.

15. The implantation system of claim 14, wherein said surfaces of said implantation chamber and said surfaces of said components of said implantation chamber are coated with said coating dopant during said first implantation process that is performed with a high implantation energy in a range of from about 35 KeV to about 45 KeV.

16. The implantation system of claim 11, further comprising:
a monitoring wafer placed within said implantation chamber for performing a third implantation process within said implantation chamber to implant a dummy dopant into said monitoring wafer, after said surfaces of said implantation chamber and said surfaces of said components of said implantation chamber are coated with said coating dopant and before said second implantation process for doping said semiconductor wafer; and
means for determining a level of contamination of said monitoring wafer after said third implantation process;
wherein said second implantation process for doping said semiconductor wafer is performed if said level of contamination of said monitoring wafer after said third implantation process is less than an upper limit.

17. The implantation system of claim 16, wherein said surfaces of said implantation chamber and of said components of said implantation chamber are further coated with said coating dopant if said level of contamination of said monitoring wafer after said third implantation process is not less than said upper limit, before said second implantation process for doping said semiconductor wafer.

18. The implantation system of claim 11, wherein said components disposed within said implantation chamber and coated with said coating dopant include an ion beam aperture, a plasma flood gun, an ion beam profiler, a wafer platen, and a dose cup.

19. The implantation system of claim 11, further comprising:
a dummy wafer comprised of substantially pure silicon and placed within said implantation chamber during said first implantation process.

20. The implantation system of claim 11, wherein said contaminants on said surfaces of said implantation chamber and of said components of said implantation chamber include heavy metal compound displaced from a first semiconductor wafer processed within said implantation chamber before said first implantation process.

* * * * *